United States Patent
Fukuda

(10) Patent No.: US 11,747,291 B2
(45) Date of Patent: Sep. 5, 2023

(54) SYSTEM FOR ESTIMATING THE OCCURRENCE OF DEFECTS, AND COMPUTER-READABLE MEDIUM

(71) Applicant: Hitachi High-Tech Corporation, Tokyo (JP)

(72) Inventor: Hiroshi Fukuda, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 331 days.

(21) Appl. No.: 17/281,628

(22) PCT Filed: Nov. 12, 2018

(86) PCT No.: PCT/JP2018/041781
§ 371 (c)(1),
(2) Date: Mar. 31, 2021

(87) PCT Pub. No.: WO2020/100180
PCT Pub. Date: May 22, 2020

(65) Prior Publication Data
US 2021/0396692 A1    Dec. 23, 2021

(51) Int. Cl.
*G01N 23/2251* (2018.01)
*G01N 23/18* (2018.01)
*G06T 7/00* (2017.01)

(52) U.S. Cl.
CPC ......... *G01N 23/2251* (2013.01); *G01N 23/18* (2013.01); *G06T 7/0006* (2013.01);
(Continued)

(58) Field of Classification Search
CPC .............. G01N 23/2251; G01N 23/18; G01N 2223/418; G01N 2223/6116;
(Continued)

(56) References Cited

U.S. PATENT DOCUMENTS

2013/0279791 A1   10/2013   Kaizerman et al.
2016/0123726 A1    5/2016   Yamaguchi et al.
(Continued)

FOREIGN PATENT DOCUMENTS

JP    10-74812 A      3/1998
JP    2007-140128 A   6/2007
(Continued)

OTHER PUBLICATIONS

International Search Report (PCT/ISA/210) issued in PCT Application No. PCT/JP2018/041781 dated Dec. 18, 2018 with English translation (four (4) pages).
(Continued)

*Primary Examiner* — Nicole M Ippolito
*Assistant Examiner* — Hanway Chang
(74) *Attorney, Agent, or Firm* — Crowell & Moring LLP

(57) ABSTRACT

The purpose of this invention is to estimate the occurrence of defects such as probability pattern defects, with a small number of inspection points. To achieve this purpose, the present invention proposes a system and a computer-readable medium. The system comprises: a step in which first data pertaining to the probability that the edge of a pattern determined on the basis of measurement data for a plurality of measurement points on a wafer is present at a first position is acquired or is generated; a step in which, if the edge is at the first position, second data pertaining to the probability that a film defect covers a region including the first position and a second position which is different to said first position is acquired or generated; and a step in which the probability of the defect occurring is predicted on the basis of the first data and the second data.

17 Claims, 9 Drawing Sheets

(52) U.S. Cl.
  CPC .............. *G01N 2223/418* (2013.01); *G01N 2223/6116* (2013.01); *G01N 2223/646* (2013.01); *G06T 2207/10061* (2013.01); *G06T 2207/30148* (2013.01)

(58) Field of Classification Search
  CPC ............ G01N 2223/646; G06T 7/0006; G06T 2207/10061; G06T 2207/30148
  See application file for complete search history.

(56) References Cited

U.S. PATENT DOCUMENTS

| | | |
|---|---|---|
| 2016/0356598 A1 | 12/2016 | Toyoda et al. |
| 2020/0033122 A1 | 1/2020 | Toyoda et al. |

FOREIGN PATENT DOCUMENTS

| | | |
|---|---|---|
| JP | 2010-243283 A | 10/2010 |
| JP | 2013-236087 A | 11/2013 |
| JP | 2014-240765 A | 12/2014 |
| JP | 2017-96625 A | 6/2017 |
| JP | 2018-56327 A | 4/2018 |

OTHER PUBLICATIONS

Japanese-language Written Opinion (PCT/ISA/237) issued in PCT Application No. PCT/JP2018/041781 dated Dec. 18, 2018 (three (3) pages).

Bisschop P., "Stochastic effects in EUV lithography: random, local CD variability, and printing failures", Journal of Micro/Nanolithography, MEMS, and MOEMS, 2017, pp. vol. 16, No. 4, (18 pages).

[FIG. 1]
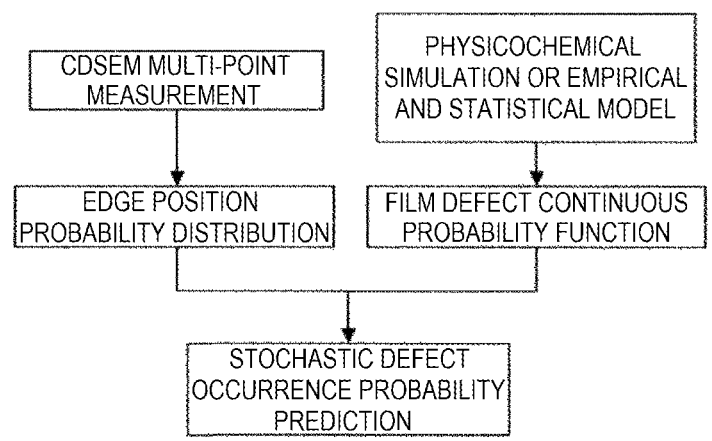

FIG. 2A
FIG. 2B 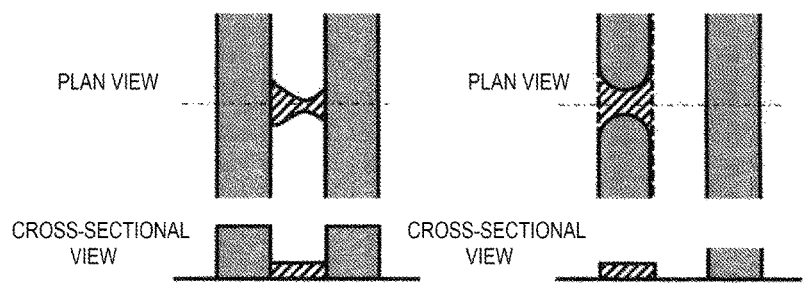 FIG. 2C
FIG. 2D 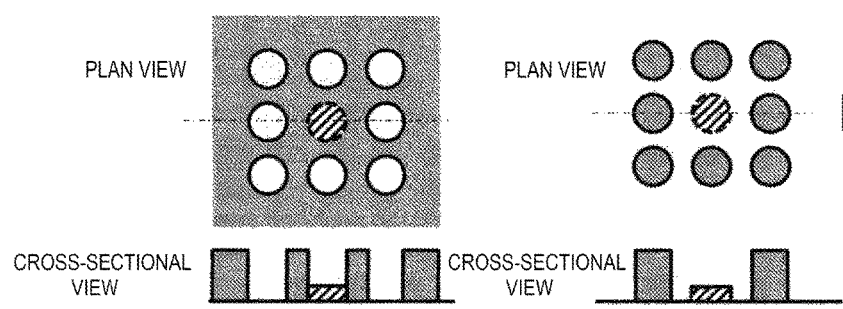 FIG. 2E

[FIG. 5]
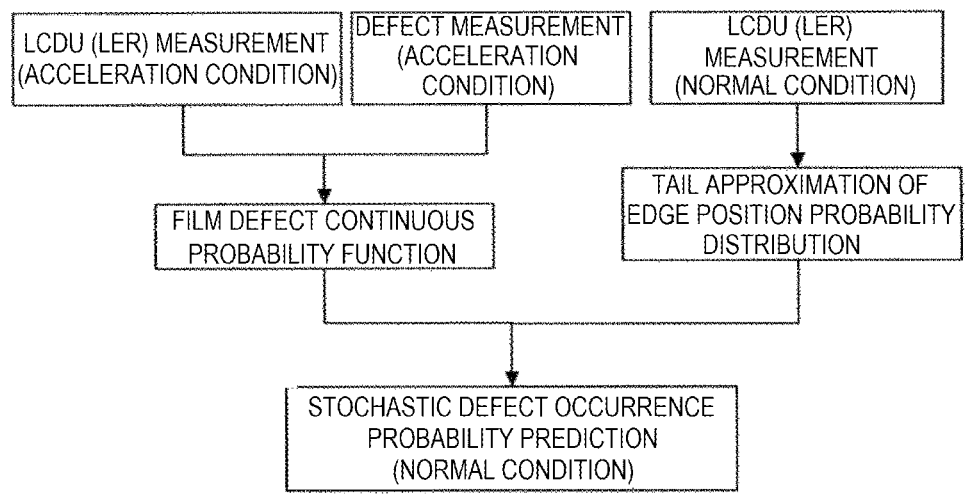

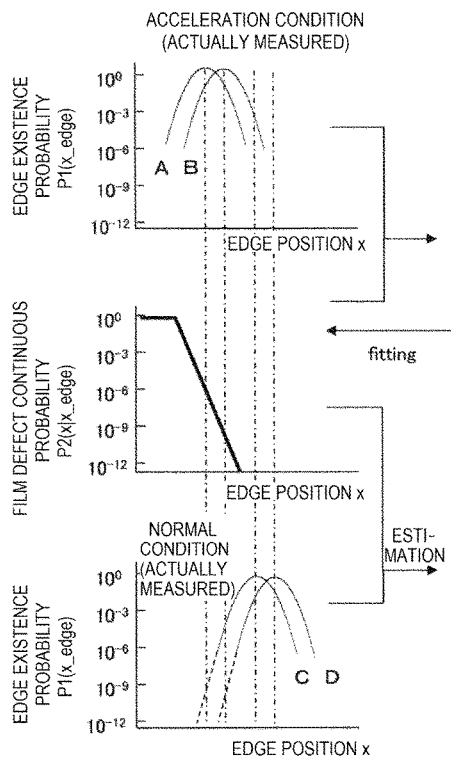
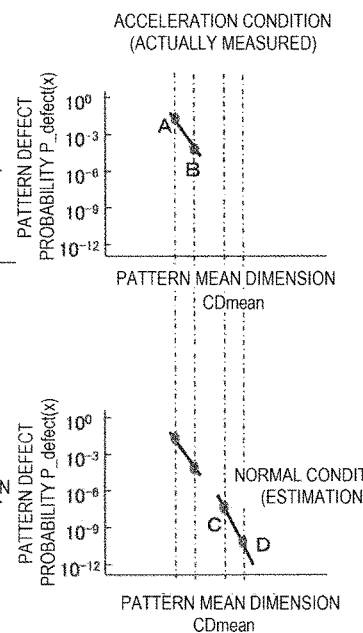
FIG. 6A, FIG. 6B, FIG. 6C, FIG. 6D, FIG. 6E

[FIG. 7]
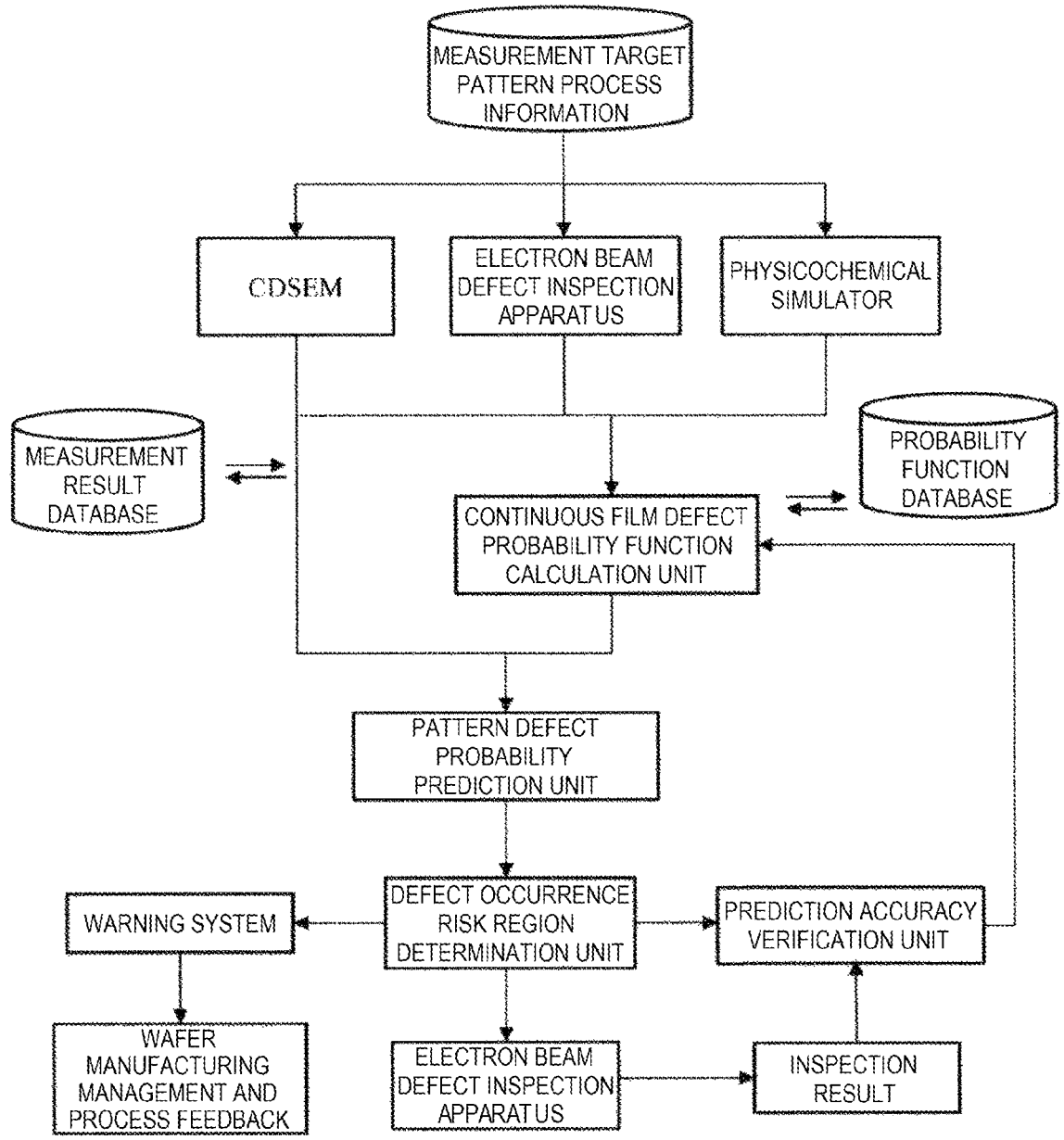

[FIG. 8]
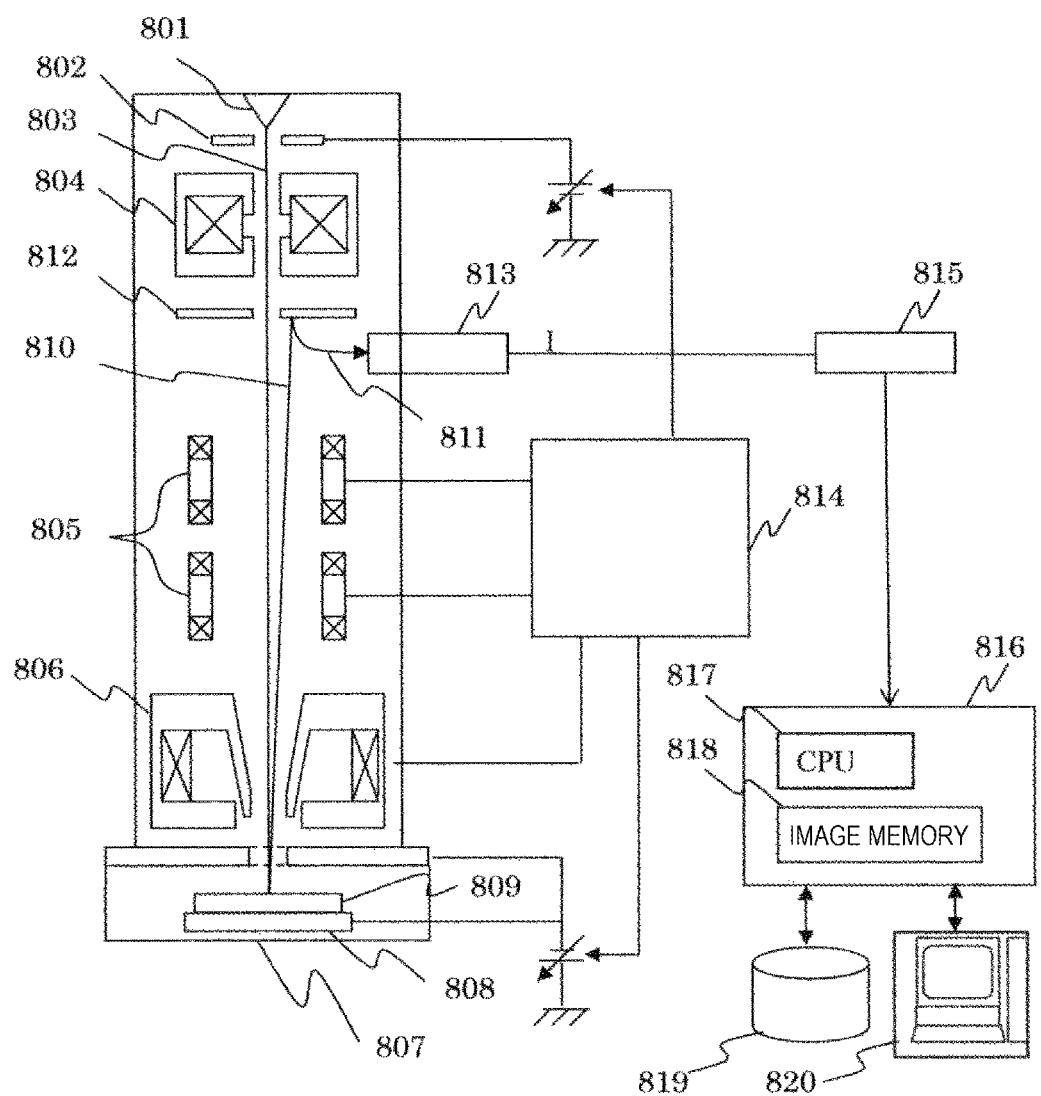

[FIG. 9]
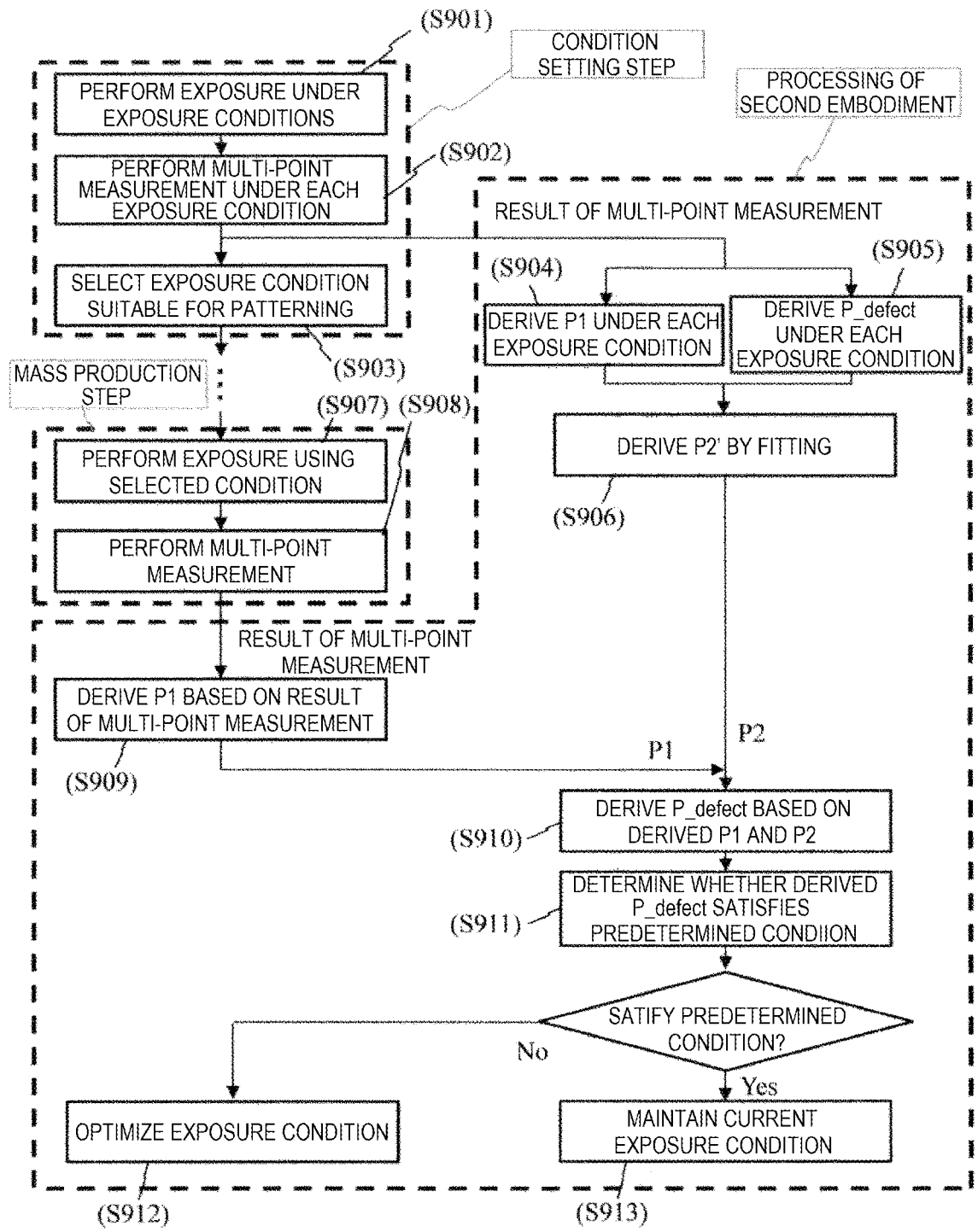

SYSTEM FOR ESTIMATING THE OCCURRENCE OF DEFECTS, AND COMPUTER-READABLE MEDIUM

TECHNICAL FIELD

The present disclosure relates to a system for estimating an occurrence of defects and a computer-readable medium, and particularly to a system for estimating an occurrence probability of fine pattern defects that occur in a very low probability with high accuracy and a computer-readable medium.

BACKGROUND ART

With miniaturization of a semiconductor device, the importance of measurement or inspection using a scanning electron microscope (SEM) capable of visualizing a pattern having a width on an order of nanometers is increased. Non-PTL 1 describes fine pattern defects that occur in a very low probability.

CITATION LIST

Non-Patent Literature

Non-PTL 1: Peter De Bisschop, "Stochastic effects in EUV lithography: random, local CD variability, and printing failures," Journal of Micro/Nanolithography, MEMS, and MOEMS, 16(4), 041013(2017)

SUMMARY OF INVENTION

Technical Problem

Stochastic pattern defects are defects that occur randomly, for example, when a huge number of patterns are exposed. Although an occurrence probability is very low, since there are an extremely large number of fine patterns on an advanced device, even a defect with a low occurrence probability has an influence on a yield. In addition, since the stochastic pattern defects are extremely fine, it is difficult to detect the stochastic pattern defects with an optical inspection apparatus, and it is desirable to inspect the stochastic pattern defects using an apparatus such as an SEM that greatly enlarges and images fine defects. However, the higher a magnification, the more time it takes to inspect a predetermined area.

On the other hand, in a manufacturing process of the semiconductor device, it is required to quickly grasp fluctuations (wafer foreign matter, distribution fluctuation in resist coating in-plane, mask or optical system deterioration) in conditions of manufacturing apparatuses, materials, and processes, and to perform an appropriate adjustment or a necessary processing. For example, when a focus condition, an exposure amount, or the like of a projection exposure device that projects light onto a resist and performs patterning fluctuates, since the quality of the pattern changes, it is required to evaluate a sample and perform an adjustment at an appropriate timing. However, it takes a lot of time to detect the presence or absence of the stochastic pattern defects, while frequent adjustment of the manufacturing apparatus causes a decrease in production amount of the semiconductor device.

Non-PTL 1 introduces stochastic pattern defects, but does not disclose an appropriate evaluation method for the defects that occur in a very low probability, such as the stochastic pattern defects. A system for estimating an occurrence of defects such as stochastic pattern defects with a small number of inspection points, and a computer-readable medium will be described.

Solution to Problem

An aspect for achieving the above object relates to a system and a computer-readable medium. The system executes a method including: acquiring or generating first data pertaining to a probability that an edge of a pattern determined based on measurement data for a plurality of measurement points on a wafer is present at a first position; acquiring or generating second data pertaining to a probability that a defect covers a region including the first position and a second position which is different from the first position when the edge is at the first position; predicting an occurrence probability of the defect based on a product of the first data and the second data.

Advantageous Effect

According to the above configuration, an occurrence of the defect such as a stochastic pattern defect can be estimated with a small number of inspection points.

BRIEF DESCRIPTION OF DRAWINGS

FIG. 1 is a diagram showing an outline of an occurrence probability prediction system for a stochastic defect.

FIGS. 2A-2E comprise a diagram illustrating a type of a defect generated in the vicinity of a pattern formed on a wafer.

FIG. 5 is a diagram showing an outline of a system for predicting an occurrence probability of the stochastic defect by obtaining a film defect probability function P2 in advance based on LCDU measurement under acceleration conditions.

FIGS. 6A-6E comprise a diagram showing a process of obtaining the film defect probability function P2 in advance based on the measurement under the acceleration conditions and estimating a defect probability P_defect based on the P2 and an edge residual probability P1 obtained by actual measurement.

FIG. 7 is a diagram showing an outline of a defect occurrence probability estimation system.

FIG. 8 is a diagram showing an example of a scanning electron microscope which is a kind of measurement tool.

FIG. 9 is a flowchart showing a relationship between a semiconductor manufacturing step and a defect occurrence probability estimation step.

DESCRIPTION OF EMBODIMENTS

Figure 3A:
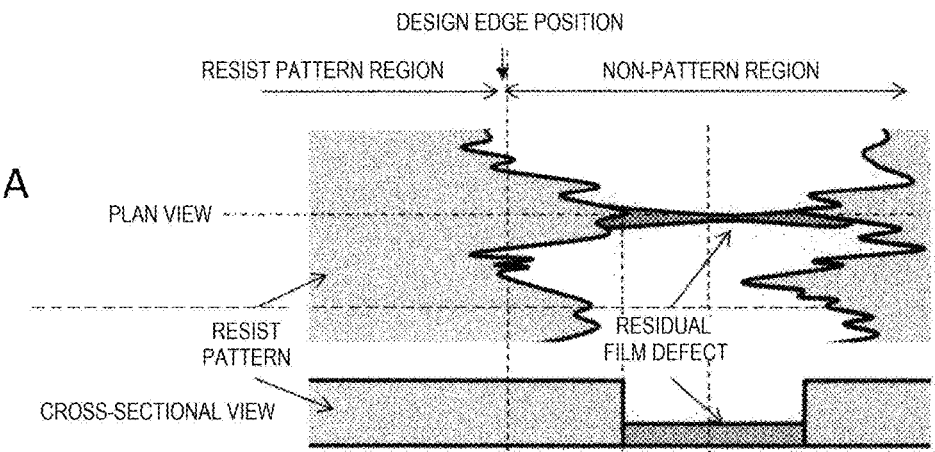
FIGS. 3A-3D comprise a diagram showing a relationship among an edge existence probability of a resist pattern, a continuous probability of a film defect remaining in a part of a non-pattern region between resist patterns, and a pattern defect occurrence probability.

Recently, the development of an extreme ultraviolet (EUV) lithography that transfers a large amount of integrated circuit patterns of 20 nm or less onto a wafer at a high speed by a projection exposure method using EUV light having a wavelength of 13 nm is in progress. However, when trying to miniaturize a pattern using the EUV lithography, it is conceivable that the presence of stochastic defects or stochastic pattern defects causes a decrease in yield. That is, when a huge number of patterns having the same dimension and design, such as fine line and space patterns, dense holes, dots, or the like are exposed to EUV, fatal defects such as bridges between lines, disconnection of the lines, and disappearance of the holes or the dots occur at random positions.

Although an occurrence probability is very low, about $10^{-12}$ to $10^{-4}$, since there are $10^{12}$ or more fine patterns for each device layer on a wafer with a diameter of 300 mm in an advanced device, when defects occur with the above probability, a large number of defects occur on the wafer and the yield is decreased. In addition, a defect occurrence probability varies greatly depending on a finished dimension of the pattern (for example, one digit at 1 nm). Therefore, the importance of pattern dimensional control has been pointed out.

Since the occurrence probability of the stochastic defects or the stochastic pattern defects is very low, it is necessary to inspect a huge number of patterns in order to directly manage the defects. On the other hand, since a defect dimension is fine, it is difficult to detect the defects optically, and electron beam inspection is desired. However, it takes an enormous amount of time to inspect a huge number of patterns in the electron beam inspection, which is slower than an optical inspection. For example, when 10,000 pieces of 1 micron square images are acquired per hour, it takes 100 hours to inspect an entire surface of a 1 mm square region. Even when an image size is 10 micron square and the number of images per hour is 100,000, it is realistically very difficult to inspect an entire surface of an integrated circuit chip or wafer larger than 1 cm square.

On the other hand, when dimensions of a large number of patterns having the same design (for example, a memory cell pattern) included in a partial region (for example, 1 mm square) on the wafer are measured, a distribution deviates from a normal distribution. Hereinafter, an example is described in which the occurrence probability of the stochastic pattern defects is predicted with high accuracy based on a realistically possible number of pattern dimension measurement results by using a relationship between the distribution of the pattern dimensions and the stochastic pattern defects.

First, a reaction process of a resist by the EUV light or the like is described. When a resist film is irradiated with patterned light, in deep ultraviolet (DUV) light such as an argon fluoride (ArF) excimer laser (wavelength: 193 nm), molecular bonds in the resist film absorb photons to cause a photoreaction. Further, in the EUV light, atoms in the film absorb the photons and emit photoelectrons isotropically. The photoelectrons change a traveling direction due to elastic scattering by peripheral atoms, energy is lost due to inelastic scattering, and secondary electrons are generated. In this phenomenon, the photoelectrons stop when the energy drops below a certain level. The secondary electrons with energy of 5 meV to 10 meV cause molecules to react. The reaction varies depending on a reaction principle of a resist material.

Currently, a typical resist system is a chemically amplified resist (CAR), which includes a matrix polymer containing an acid generator (PAG) and a plurality of polarity converting groups as components. Acid generator (PAG) molecules that absorb the photons in the DUV and the energy of the secondary electrons in the EUV generate an acid, and the acid acts as a catalyst within a range of acid diffusion length centered on an acid generation position, and causes a polarity reversal reaction of polar groups of a polymer or molecule having a long catalytic chain (the number of catalytic reactions induced by one acid). When the number of polarity inversion groups in the polymer exceeds a certain threshold, solubility of the polymer is reversed and a pattern is formed by a developing process.

In patterning of 40 nm or less, it is confirmed that nanometer-level random irregularities (line edge roughness: LER) as shown in FIG. 2(a) are formed on edges of the pattern. Main causes are shot noise of the number of the photons, a spatial composition variation of the resist material, a stochastic variation of the reaction, and the like.

The LER is formed in both a pattern formed by exposure using the argon fluoride excimer laser and a pattern formed by exposure using the EUV light, while the stochastic pattern defects are not confirmed in the pattern formed by the exposure using the argon fluoride excimer laser. Therefore, the latter is considered to be due to a problem of the resist material peculiar to a region of 20 nm or less, or a difference in wavelength (a difference in reaction process due to a difference in number of the photons and in photon energy), but a cause thereof is not always clear.

Here, a main pattern formation and an occurrence of the stochastic pattern defects are defined as follows. A state in which a film having a predetermined thickness remains in a region (a pattern portion) where the resist should remain in design and the resist in a region (a non-pattern portion) where the resist should be removed is completely removed is defined as pattern formation. Next, a case where the resist having a predetermined ratio (for example, 10% to 30%) or more of a desired film thickness remains in a part of the non-patterned portion is defined as a residual film defect, and a case where the resist film disappears at a predetermined ratio (for example, 10% to 30%) or more of a desired film thickness in a part of the pattern portion is defined as a disappearing film defect.

The predetermined ratio is determined by an etching process. Further, a case where a region of the film defect extends to a range that hinders a function of a design pattern and interferes with a resist mask function in subsequent etching is defined as a pattern defect. For example, the pattern defect includes a case where the residual film defect extends to a region connecting two independent design patterns (a bridge defect, for example, FIG. 2(b)), a case where an entire surface of a fine opening pattern is filled (a disappearing opening, a pattern in a center in FIG. 2(d)), a case where a film disappearance defect cuts a linear design pattern (a brig defect, FIG. 2(c)), and a case where a part of a fine dot pattern is disappeared (a disappearing dot, FIG. 2(e)).

Based on an estimation of the occurrence of the stochastic defects, for example, an appropriate timing of feeding back to exposure conditions of an exposure device can be specified, and as a result, semiconductor manufacturing can be continued without frequent exposure condition adjustment. However, the invention is not limited to this, and it is also possible to estimate the occurrence of the stochastic defects due to, for example, mask contamination. Estimating the occurrence of the stochastic defects due to the mask contamination makes it possible to carry out mask cleaning at an appropriate timing. Further, a timing of a cleaning processing on a back surface of the wafer can be appropriately planned based on the estimation of the stochastic defects caused by a focus shift caused by a foreign matter adhering to the back surface of the wafer. Further, an estimation method of the disclosure can also be used for estimating the occurrence of the stochastic defects caused by a resist sensitivity shift or the like due to an abnormality in a resist process (a coating development track).

Further, according to the method of the disclosure, it is also possible to detect an abnormal wafer, and it is possible to apply the method to elimination of the abnormal wafer.

According to an examination of the inventor, the occurrence probability of the randomly occurring pattern defect is represented by a product of two probabilities, an existence probability of an edge position of the main pattern and a probability of continuous film defect occurring in the region in contact with the edge. That is, the occurrence probability can be represented by conditional probabilities of two events. Therefore, in an embodiment described below, as shown in FIG. 1, the existence probability of the edge position is obtained by measuring the pattern by a measuring unit such as an SEM, the continuous film defect occurrence probability is obtained by a physicochemical simulation or an empirical and statistical model, and the occurrence probability of the stochastic pattern defect (hereinafter referred to as the pattern defect or simply the defect) is estimated by the product of the existence probability and the continuous film defect occurrence probability.

Here, according to the examination of the inventor, the continuous film defect occurrence probability is a function of the edge position. Therefore, when a process condition, a wafer state, a mask state, or the like changes, an existence probability distribution of the edge position changes, and a film defect occurrence probability changes according to the change of the edge position, so that the defect occurrence probability changes. Further, since a change in an edge position dependence of the film defect occurrence probability due to the above-mentioned various conditions and state changes is small, a form of a probability function as the function of the edge position is approximated to be constant.

Therefore, $10^{12}$ pattern inspections which are necessary to detect the defects occurring with a probability of $10^{-12}$, can be replaced by, for example, $10^6$ pattern measurements which are necessary to detect an abnormality in an edge position distribution occurring with a probability of $10^{-6}$. Therefore, it is possible to detect a risk of the occurrence of the above defects within a realistic time.

Hereinafter, for the sake of simplicity, in a periodic pattern (a line and space pattern with a longitudinal direction in a y direction) whose intensity is modulated in an x direction, a case (corresponding to FIG. 2(b)) where the residual film defect covers a part of the non-pattern region between resist patterns are described with reference to FIG. 3. According to the examination of the inventor, the occurrence probability of the stochastic pattern defect in this case can be approximately obtained as follows.

First, a probability that an edge of the main pattern exists at a position x_edge (a first position) is set to P1 (x_edge). The Pl(x_edge) indicates a frequency distribution of the x_edge obtained based on measurement data of a plurality of measurement points when an edge position coordinate relative to a reference edge position (a design edge position in FIG. 3(a)) is set to the x_edge. Further, when the edge is at the x_edge, a probability function that the film defect continuously occurs between the x_edge and a defect evaluation point x (a second position) is defined as P2 (x, x_edge). Based on the P1 (x_edge) and the P2 (x, x_edge) obtained in this way, a pattern defect probability P_defect (x) at x is obtained according to Equation 1.

$$P_{defect(x)} = \int (P1(x\_edge) \cdot P2(x,x\_edge)) dx\_edge \qquad \text{[Equation 1]}$$

That is, the pattern defect occurrence probability connecting a certain position and the edge in the pattern is represented by the product of two partial probabilities, the edge appearance probability P1 (x_edge) and the probability P2 (x, x_edge) that the film defect covers the region connecting the edge and the above position.

Next, the occurrence of the defects and the detection thereof in an actual manufacturing process are described. First, as a premise, it is assumed that the pattern defect occurrence probability is controlled to a desired level in a reference state (hereinafter referred to as a process state) of an exposure process, the resist material, an exposure mask, and the wafer. Therefore, it is assumed that the process state changes due to fluctuations in the exposure condition, the mask contamination, changes in the wafer state (changes in a focus position due to the foreign matter on the back surface, or the like).

At this time, each of the changes in two elements of the above equation, the edge appearance probability P1 (x_edge), and the probability P2 (x, x_edge) that the film defect covers the region connecting the certain position x (for example, a defect reference point such as the center of the non-patterned region) when the edge is at the x_edge, is described.

First, the above-mentioned LER exists at the edge of the resist pattern formed for the same design pattern on an actual wafer, and the edge position x_edge fluctuates along the edge as shown in FIG. 3(a). Therefore, the P1 (x_edge) is obtained by measuring a large number of edge points along the edge of one line pattern, for example, under reference process conditions (FIG. 3(b)). The P1 (x_edge) changes from the conditions A to B in FIG. 3(b) in accordance with the change in the process state.

A rate of change in the distribution increases in a portion away from a mean value. For example, in a normal distribution or a Poisson distribution, as a general property, the rate of change of a value when a mean value or a standard deviation changes increases as a distance from the mean value increases. This fact is also observed in an actual dimensional (edge position) distribution, which is not always represented in the normal distribution or the Poisson distribution.

Next, the change in the probability P2 (x, x_edge) that the film defect covers the region connecting the edge and the defect evaluation point is described. The P2 (x, x_edge) can be calculated by some hypothetical models, and can be expressed as a direct product in the above region of a probability P3 (x') that the film defect occurs per unit area, for example, as in Equation 2.

$$P2(x, \text{x\_edge}) = \prod_{x\_edge < x' < x} P3(x') \qquad \text{[Equation 2]}$$

Figure 4A:
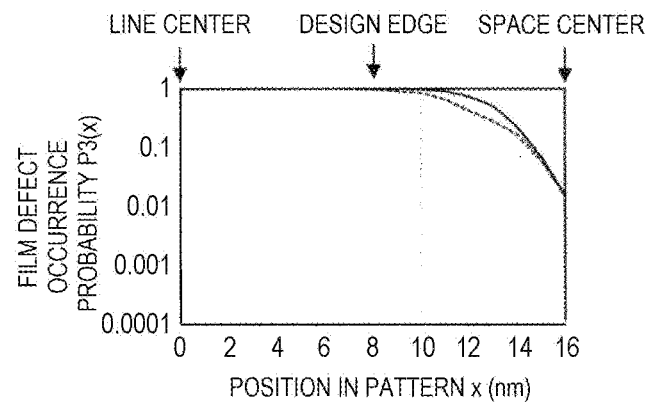
FIGS. 4A-4C comprise a diagram showing a relationship between a continuous film defect probability P2 and a film defect occurrence probability P3.

FIG. 4(a) shows the probability P3 obtained by a simulation described later. The change in the probability P3 when the exposure conditions change is relatively small as shown by a solid line and a dotted line in the figure. The reason is that the film defect occurrence probability per unit area is substantially proportional to the above state change (for example, a change in an exposure amount profile of at most several percent).

Figure 4B:
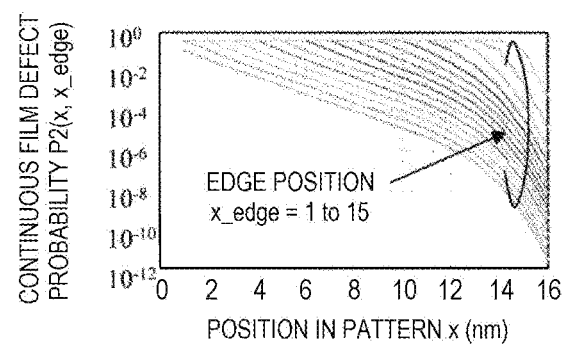
Figure 4C:
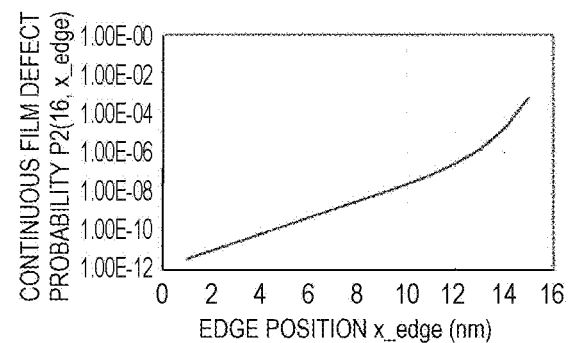

On the other hand, an x-x_edge dependence of the P2 calculated by the above equation with respect to the probability P3 shown in FIG. 4(a) is shown in FIG. 4(b) and FIG. 4(c). FIG. 4(c) shows the x-x_edge dependence of the P2 at the center of the non-patterned region (x=16 nm). A value of the P2 decreases exponentially with respect to |x-x_edge|. Even in other models, the value decreases exponentially with respect to |x-x_edge|. As described above, the change of the P2 due to the change of the conditions is dominated by a part through the change of the x_edge. Therefore, in this example, it is basically approximated that the change in the P2 when the condition changes depends only on the change in the x_edge.

Figure 3B:
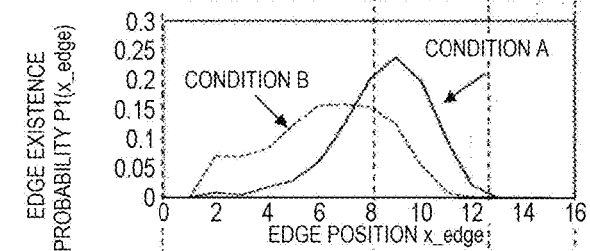
Figure 3C:
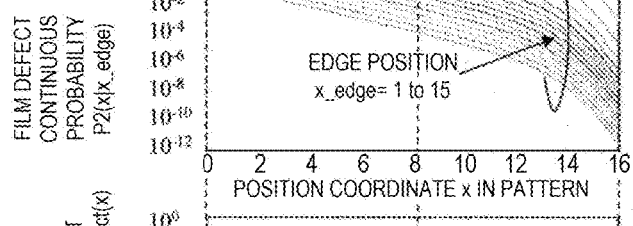
Figure 3D:
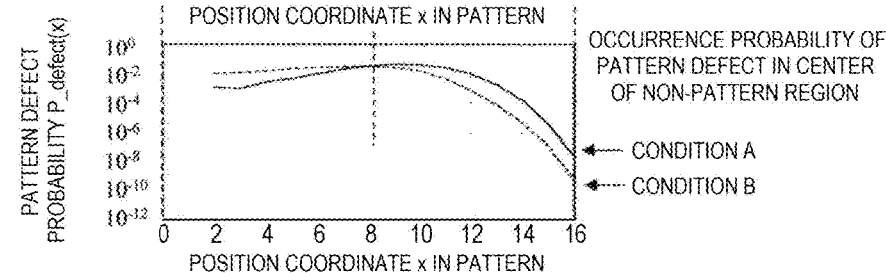

Based on the results of FIG. 3(b) and FIG. 3(c), the defect probability can be obtained as shown in FIG. 3(d) using Equation 1. It can be seen that the defect probability of a portion of the non-patterned region changes by about two orders of magnitude due to a slight change in a mean edge position (about 2 nm).

Therefore, when the process state changes, the distribution P1 (x_edge) of the edge position x_edge changes, and the probability P2 (x, x_edge) that the film defect covers the region connecting the edge and the defect reference point changes exponentially. In this example, a factor influencing the change in the pattern defect occurrence probability is approximated to be dominated by edge fluctuations, and the defect occurrence probability is estimated based on a calculation formula using a measured value observed on the actual wafer for the distribution of the edge position and using an estimated value obtained by statistical analysis for a product part of a film defect occurrence probability spatial distribution that cannot be directly measured. Or a risk of the defects is predicted.

As described above, since the defect occurrence probability is very low (for example, $10^{-12}$), it is necessary to measure a huge number of samples in order to actually detect the defect, which is realistically difficult.

In the embodiment described below, the result can be obtained by measuring, for example, about $10^6$ points, which is far less than $10^{12}$ points by representing the defect occurrence probability as the product of two larger probabilities (for example, $10^{-6}$ each) represented as a function only of each edge position. Measurement results of 1,000,000 edge positions can be obtained by, for example, taking hundreds to thousands of images with a critical dimension-SEM (CD-SEM), which is one kind of established measurement tool, and the time required for the measurement is about several minutes to several tens of minutes.

The measurement of the edge position by the SEM may detect the edge position on one scanning line, but in practice, the average of signals obtained for a plurality of adjacent scanning lines or the average of the edge positions obtained for each of the plurality of scanning lines maybe used. However, it is desirable that an obtained edge position reflects local fluctuations in the edge position, and it is desirable that a length in an edge direction used for the above average is about the same as or less than a minimum pattern width (for example, typically 10 nm to 20 nm).

When the edge position is far from the mean value (for example, when a space width is narrowed), the change in the edge appearance probability due to the state change is large, and |x-x_edge| (for example, a distance between the edge and the center of a space) is small and the value of the P2 is large, so that an influence on the defect occurrence probability is large. Therefore, a measurement of a tail portion of the edge position distribution is particularly important.

FIG. 8 is a diagram showing an example of the CD-SEM which is one kind of measurement tool for measuring the edge position for mainly obtaining the P1 and outputting the measurement data (metrology data). The CD-SEM includes a scanning electron microscope and one or more computer systems for identifying pattern dimensions or edge positions (for example, a difference from the design edge position) based on an output of a detector. The computer system is configured to read a program stored in a predetermined computer-readable medium and execute a defect probability estimation processing as described later. The computer system is configured to be communicable with the scanning electron microscope. The computer system may be connected to the scanning electron microscope by one or more transmission media and installed at a position separated from the scanning electron microscope, or may be a module of the scanning electron microscope.

In the scanning electron microscope illustrated in FIG. 8, an electron beam 803 is extracted from an electron source 801 by extraction electrodes 802 and accelerated by acceleration electrodes (not shown). The accelerated electron beam 803 is focused by condenser lenses 804, which is a form of a focusing lens, and then deflected by scanning deflectors 805. Accordingly, a sample 809 is scanned one-dimensionally or two-dimensionally with the electron beam 803. The electron beam 803 incident on the sample 809 is decelerated by a deceleration electric field formed by applying a negative voltage to electrodes built in a sample table 808, and is focused by a lens action of objective lenses 806 to incident on a surface 809. A vacuum is maintained inside a sample chamber 807.

Electrons 810 (secondary electrons, backscattered electrons, or the like) are emitted from an irradiation portion on the sample 809. The emitted electrons 810 are accelerated in a direction of the electron source 801 by an acceleration action based on the negative voltage applied to the electrodes built in the sample table 808. The accelerated electrons 810 collide with conversion electrodes 812 to generate secondary electrons 811. The secondary electrons 811 emitted from the conversion electrodes 812 are captured by a detector 813, and an output I of the detector 813 changes depending on an amount of the captured secondary electrons. A brightness of a display device changes according to a change in the output I. For example, when forming a twimage, a deflection signal to the scanning deflectors 805 and the output I of the detector 813 are synchronized to form an image of a scanning region.

Although the SEM illustrated in FIG. 8 shows an example in which the electrons 810 emitted from the sample 809 are once converted into the secondary electrons 811 at the conversion electrodes 812 and detected. Of course, the invention is not limited to such a configuration, and for example, a configuration maybe adopted in which an electron double image tube or a detection surface of the detector is arranged on a trajectory of the control signals to each optical element of the SEM according to an operation program for controlling the SEM called an imaging recipe.

Next, a signal detected by the detector 813 is converted into a digital signal by an A/D converter 815 and the digital signal is transmitted to an image processing unit 816. The image processing unit 816 generates an integrated image by integrating signals obtained by a plurality of scans in frame units.

Here, an image obtained by one scanning of the scanning region is referred to as a one-frame image. For example, when integrating images of 8 frames, the integrated image is generated by performing addition averaging processing on a pixel unit for the signals obtained by eight two-dimensional scans. It is also possible to scan the same scanning region a plurality of times to generate and save a plurality of images of one frame for each scanning.

Further, the image processing unit 816 includes an image memory 818 which is an image storage medium for temporarily storing a digital image, and a CPU 817 which calculates feature amounts (a dimensional value of a line or a hole width, a roughness index value, an index value indicating a pattern shape, an area value of the pattern, a pixel position as the edge position, or the like) from the image stored in the image memory 818.

Further, a storage medium 819 that stores a measured value of each pattern, a brightness value of each pixel, or the like is included. An overall control is such that necessary device operations, confirmation of detection results, or the like performed by a workstation 820 can be implemented by a graphical user interface (hereinafter referred to as GUI). Further, the image memory is configured to store output signals (signals proportional to an amount of the electrons emitted from the sample) of the detector at an address (x, y) on a corresponding memory in synchronization with scanning signals supplied to the deflector 805. The image processing unit 816 also functions as an arithmetic processing device that generates a line profile based on the brightness value stored in the memory, specifies the edge position by using a threshold method or the like, and measures a dimension between the edges.

Hereinafter, a defect occurrence probability estimation method, a system that executes defect occurrence probability estimation, and a computer-readable medium in which a program for causing the computer system to execute the defect occurrence probability estimation is stored will be described.

First Embodiment

Hereinafter, an embodiment of the defect occurrence probability estimation will be described. First, local dimensions of a periodic pattern uniformly existing in a region of about 100 μm square on a finely patterned wafer are measured at a large number of points using a CDSEM, and a distribution F (x1) of a pattern edge position x1 with respect to the center of each pattern is obtained. Here, approximately 250 SEM images are acquired with a SEM field of view (FOV) of 1 micron square for a 16 nm line-and-space (L/S) pattern formed on the wafer using an EUV exposure device and a chemical amplification resist. For each of approximately 25 lines included in each image, a distance from the center to a right-side edge is averaged and measured in a 5 nm range every 5 nm in the edge direction. Accordingly, about 4000 edge positions per image, a total of 1,000,000 edge positions are measured, and the distribution of the edge positions and P1 (x_edge) are obtained.

Next, a partial probability of the occurrence of the defect is obtained using a computer. The probability function P2 (x, x_edge) that the film defect occurs in the region connecting the position x_edge and the position x when the edge is at the position x_edge is obtained by the following two methods.

First, as a first method, a film defect occurrence probability P3 (x) at the position x in the design pattern (per unit area) is obtained based on layout information and exposure conditions of the design pattern as follows. With a physiochemical simulation using a Monte Carlo method, an event density n (the number of events per local volume) of a polarity reversal reaction of a resist material polymer polar group or a solubility inversion of the polymer at the position x is calculated, and a first stochastic density distribution function g1 (x, n) with the position x and the event density n as stochastic variables is calculated. A method for calculating the g1 using the Monte Carlo method will be described in another embodiment.

The g1 is obtained by a simulation based on a predetermined physical law, and a normal distribution having a mean value and a standard deviation with x and n as functions, a Poreson distribution, or the like may be used. Parameters of these distribution functions can be obtained by fitting results of the above physiochemical simulation.

Next, the first stochastic density distribution function g1 is integrated in a predetermined range of n to obtain the probability P3 (x) per unit area where the film defect occurs at the position x. Further, a direct product of P3 (x) is obtained between x=x_edge to x, and the direct product is taken as P2 (x, x_edge). What is obtained by this method is the probability of defect caused by accidental adjacent connection of the shot noise.

In a second method, P2 is calculated using Equation 3. First, a light intensity distribution I(x) is calculated for the above pattern by an optical image simulation. Next, a probability P4 (x, x_edge, r0) that the photons absorbed at a coordinate r0 invert the solubility of the polymer in the region connecting the edge position x_edge and the position x is obtained. The probability P4 has a predetermined density in the region along a trajectory caused by scattering of the photoelectrons generated by the photon absorption, and may be approximated by a probability that the secondary electrons are generated. These probabilities are obtained by a Monte Carlo simulation based on a predetermined physical law, but may be approximated by various stochastic distribution functions using x, x_edge, n as stochastic variables. The calculation method using the Monte Carlo method will be described in another embodiment. The probability function P2 that a continuous film defect occurs between the position x_edge and the position x when the edge is at the position x_edge is obtained by using Equation 3. Conv (A, B) is a convolution of A and B.

$$P2(x,x\_edge)=\text{conv}(I(r0), P4(x,x_{edge}, r0))$$ [Equation 3]

The derivation of the probability P2 based on the probability P4 can be defined as, for example, obtaining a probability that the photoelectrons generated by the photons of light projected on the resist film formed on the wafer generate secondary electrons in proximity between the coordinate x_edge and the coordinate x of the resist film.

Since the probabilities P2 obtained by the first method and the second method are each a probability function that the film defect occurs based on different factors, the two probabilities P2 are added together by a linear combination or the like. However, if the influence of one method is dominant and the influence of the other method can be ignored, the probability P2 may be calculated with only the one method.

A defect probability P_defect(x) at the position x is obtained by using P1 (x_edge) and P2 (x, x_edge) obtained as described above, and Equation 1.

The above processing is performed on one region in a chip for 30 chips in the wafer and 10 regions in a chip for three chips in the wafer, a total of 60 regions, and an in-wafer distribution and an in-chip distribution of the defect occurrence probability are determined. An extension is observed in a tail of the edge position distribution at a specific position of a wafer edge portion and the chip, and it is predicted that the defect occurrence probability deteriorates by two orders of magnitude from $10^{-11}$ to $10^{-9}$ accordingly. When a defect inspection is performed on a 1 mm square region of the position on the wafer and the chip using a high-speed electron beam inspection apparatus, defects having a density predicted above are detected.

In the present embodiment, the periodic pattern in which long patterns in a specific one-dimensional direction are periodically arranged, such as a line-space pattern, is described as an example, but the same applies to an isolated pattern or a two-dimensional pattern such as a hole or a dot.

Second Embodiment

Next, a method of obtaining P2 (x, x_edge) of Equation 1 by a statistical processing of measurement results without using the above physicochemical simulation will be described.

When exposure and mask conditions such as an exposure amount or a mask dimension are changed, a mean finished dimension of the resist pattern changes. At this time, when the pattern defect occurrence probability is measured, the defect probability changes very sensitively (exponentially) with respect to the mean finished dimension. As described above, in the disclosure, the pattern defect occurrence probability is regarded as the product of an occurrence probability at a "local" edge position and an accompanying change in a local continuous film defect generation probability. Therefore, the occurrence probability P1 (x_edge) at the local edge position obtained by LCDU or LER measurement and P2' (x_edge) that satisfies Equation 4 for the defect occurrence probability P_defect actually measured for the same sample are obtained by, for example, statistical fitting.

$$P_{defect(x)} = \int (P1)x\_edge) \cdot P2'(x\_edge)) dx\_edge \quad \text{[Equation 4]}$$

In particular, in the present embodiment, P2' (x_edge) is obtained under acceleration conditions with a high defect occurrence probability, and then P2' (x_edge) is applied to normal wafer processing conditions (FIG. 5). Here, local critical dimension uniformity (LCDU) is an index value indicating uniformity of a CD value in a local field, and is a value obtained as a result of measuring a plurality of patterns in the local field.

First, under a plurality of (i=1 to m) exposure and mask conditions in which the defect occurrence probability is high and a non-zero defect appears within a realistically possible number of measurement points, a frequency distribution (or a dimensional distribution) P1 (x_edge, i) of the edge position x_edge and a defect occurrence probability Pdi_observed (i) are measured (corresponding to A and B in FIG. 6(a) and FIG. 6(b)). Next, P2' (x_edge) is determined such that δ of Equation 5 is minimized (FIG. 6(c)).

$$\delta = \Sigma |Pd\_observed(i) - Pd\_predicted(i)|^2 \quad Pd_{predicted}(i) = \int (P1(x_{edge}, i) \cdot P2'(x_{edge}) dx\_edge) dx\_edge \quad \text{[Equation 5]}$$

Next, the edge position frequency distribution P1 (x_edge) is measured under normal exposure and mask conditions (C and D in FIG. 6(6d)), whereas the defect occurrence probability is estimated according to Equation 1 using P2' (P2) obtained under the above acceleration conditions (C and D in FIG. 6(e)).

It is considered that a calculation result of the defect occurrence probability obtained in the disclosure is dominated by the tail of the frequency distribution of the dimension or the edge position.

Under the normal exposure conditions, it may be difficult to continue the measurement until the tail of the edge distribution extends to x, which gives a peak of an integrand function of (Equation 1), within a realistically possible time. In this case, the tail of the distribution may be extrapolated as appropriate. In particular, since P1 (x_edge) deviates from the normal distribution while being away from the center of the distribution, at the time of starting being deviated from the normal distribution, the tail may be extrapolated and approximated (dotted part of curves C and D) by an exponential distribution extending in contact with the normal distribution as shown in the curves C and D in FIG. 6(d).

Further, it is desirable to assume an appropriate functional type for the P2' (x_edge). As a prototype, a method based on the physicochemical simulation obtained in the first or second embodiment or a method of deconvolving an observed defect probability dimensional dependence with a dimensional distribution can be applied.

Further, the present embodiment can be combined with the method described in the first embodiment. For example, it is assumed that the present embodiment is applied to a certain design mask pattern to obtain the P2' (x_edge). Next, when the design of the mask pattern is changed, the P2' (x_edge) for the changed mask needs to be obtained again.

In this case, instead of applying the present embodiment again, according to the method shown in the first embodiment, continuous film defect probabilities P2_old (x_edge) and P2_new (x_edge) before and after the change are calculated, and the P2' for the changed mask is obtained using Equation 6.

$$P2'\_new(x_{edge}) = P2'\_old(x\_edge) \cdot \frac{P2\_new(x\_edge)}{P2\_old(x\_edge)} \quad \text{[Equation 6]}$$

The above change is also the same when the exposure conditions or other process conditions are changed. In this case, as compared with a case where the first embodiment is used alone, various conditions can be dealt with without rigorously calibrating the simulation.

When there is a dimensional variation (LCDU or LER), the pattern defect probability becomes a mean pattern dimensional dependence and a convolution of the dimensional distribution, and deteriorates (increases). However, the measured defect probability is a result obtained with respect to a mean dimension of a pattern group whose edge position fluctuates locally by the LCDU and the LER. That is, the defect occurrence probability when the mean dimension is a certain value is discussed, and a relationship with the dimensional variation distribution is not clear. According to the disclosure, the defect occurrence probability and the change thereof can be quantitatively estimated based on the observed dimensional variation (the LCDU or the LER) and the change thereof.

FIG. 9 is a flowchart showing an example of a specific step of calculating a defect occurrence probability P_defect. The example of FIG. 9 describes an example of selecting a plurality of patterns (exposure conditions) exposed under exposure conditions (acceleration conditions) where defect occurs frequently due to improper focus or exposure amount and deriving P1 (x_edge) and P_defect for deriving the P2' (x_edge) based on the measurement of the pattern having the selected exposure conditions, from a focus exposure matrix (FEM) wafer or the like used when conditions of a projection exposure device are set.

First, in order to specify appropriate exposure conditions of the projection exposure device, the exposure conditions (the focus, the exposure amount, or the like) are changed, and exposure is performed under each exposure condition (step 901). Next, multi-point measurement is performed on the pattern formed under each exposure condition using the CD-SEM or the like (step 902). As a result of the multi-point measurement, exposure conditions during mass production are determined by selecting design data of a semiconductor device or exposure conditions for forming the pattern of measured values that match allowable values determined based on the design data (step 903).

On the other hand, in a condition setting step of determining the exposure conditions, the exposure is performed while changing the exposure conditions to form patterns under various exposure conditions, and therefore, exposure conditions under which the pattern is not properly formed (including the defect) are included. Therefore, a pattern with an exposure condition (acceleration condition) having a high defect occurrence rate is selected from these patterns, the P1 and the P_defect are derived for each exposure condition (steps 904 and 905), and the P2' is derived by statistical fitting as described above (step 906). For example, data required for deriving the defect occurrence probability described later is prepared in advance by deriving the P1 and the P_defect for each of a plurality of samples having different defect probabilities, such as a wafer (or chip) having 100 defects and a wafer having 50 defects in 100,000 measurement points and deriving the P2' common to these samples.

In an actual semiconductor mass production step, the patterning using the exposure conditions selected in the condition setting step of the exposure device is performed (step 907), and for process management, pattern measurement using the CD-SEM or the like (step 908) and adjustment of the exposure device are performed as necessary. The disclosure is for reducing labor or time required for the measurement by estimating the occurrence of the stochastic defects based on the measurement for a limited number of measurement points. According to the method of the disclosure, it is possible to prevent a decrease in productivity due to frequent adjustment of the exposure device and to maintain a high yield at the same time.

As illustrated in FIG. 9, the P1 (x_edge) is derived based on the result of the multi-point measurement (for example, 100,000 points) for the wafer formed in the mass production step (step 909). Next, the defect occurrence probability during the mass production is derived by deriving the P_defect from the P2' (x_edge) obtained in advance in step 906 and the P1 (x_edge) derived in step 909 (step 910).

The derived defect occurrence probability is compared with a preset predetermined condition (for example, defects of n points "or less" among $10^{12}$ measurement points), and when the predetermined condition is satisfied, the production is continued as it is (step 913). On the other hand, when the predetermined condition is not satisfied (when defects of n points or more occur), a reason is investigated and appropriate measures are taken. For example, when the reason can be dealt with by the setting of the exposure device, the adjustment is performed (step 912) and the production is continued (step 913). When the reason is unclear, the production of the wafer is interrupted.

The computer system appropriately displays the defect occurrence probability on a display device or the like provided on the CD-SEM, so that an operator can grasp an appropriate adjustment timing of the exposure device. Further, by issuing an alarm when the defect occurrence probability does not satisfy the predetermined condition, the operator can know the appropriate adjustment timing of the exposure device.

The present embodiment may be implemented by supervised machine learning. That is, for example, by a machine learning method using a neural network such as a deep neural network or a convolutional neural network, a neural network is created in which the acceleration condition (i=1 to m) is used as a teacher, a dimension frequency distribution function P1 (x_edge, i) is used as an input vector, and the defect occurrence probability Pdi_observed (i) for the corresponding condition is output. In other words, a learning model is generated that receives the P1 (x_edge) and outputs the occurrence probability of the defect and in which a parameter learned by using teaching data is provided as second data in an intermediate layer.

After that, an optional dimensional frequency distribution function P1 (x_edge, i) is input to the neural network to predict the defect occurrence probability. That is, by inputting the P1 (x_edge) into a constructed learning model, the occurrence probability of the defect is output. Accordingly, the continuous film defect probability P2 (x_edge) is automatically embedded in the network regardless of Equation 5. Prediction results are appropriately verified by a total inspection, and the network is corrected using verification results.

Third Embodiment

Next, an outline of a defect occurrence probability estimation system will be described. A defect occurrence probability estimation system illustrated in FIG. 7 is formed of one or more computer systems. The system illustrated in FIG. 7 includes subsystems such as a a CDSEM, an electron beam defect inspection apparatus, a measurement result database unit, a physicochemical simulator unit, a film defect probability function calculation unit, a probability function database unit, and a pattern defect probability prediction unit.

The CDSEM illustrated in FIG. 7 receives measurement target pattern information, obtains the P1 (x_edge) based on an image or dimensional data obtained by measuring a large number of patterns, and stores the P1 (x_edge) into the measurement result database unit. The P1 or the like may be obtained by being calculated by a processor provided in the CDSEM, obtaining a calculation result thereof by the processor provided in the CDSEM, and performing the calculation as illustrated in Equation 1 by the processor, or may be obtained by receiving the multi-point measurement result (edge position information of a plurality of measurement points) from the CDSEM and generating data (first data) such as P1 through the calculation by a processor provided separately from the CDSEM.

If necessary, the physicochemical simulator unit calculates the above-mentioned g1 (x, n), P3 (x), I (x), P4 (x, x_edge, r0), P2 (x, x_edge), and the like described in the first embodiment. Further, if necessary, the electron beam defect inspection apparatus measures the number of pattern defects (the defect probability) of a target pattern group. The continuous film defect probability function calculation unit calculates the P2 (x, x_edge) using the calculation result of the physicochemical simulator unit by the method described in the second embodiment. Alternatively, the continuous film defect probability function calculation unit calculates the P2 (x, x_edge) based on the P1 (x_edge) and the number of the pattern defects (the defect probability) measured by the electron beam defect inspection apparatus by the method described in the second embodiment.

The probability function database unit stores the calculated P2 (x, x_edge). The pattern defect probability prediction unit calculates the defect probability P_defect(x) based on the above P1 (x_edge) and P2 (x, x_edge). Hereinafter, details of each subsystem will be described. Other subsystems shown in FIG. 7 will be described later.

Data such as images, edge coordinates, and dimensions measured by the CDSEM are stored in, for example, a measurement result database. The physicochemical simulator unit calculates the g1 (x, n), P3 (x), I(x), P4 (x, x_edge, r0), P2 (x, x_edge) or the like. Hereinafter, a calculation method will be described.

For example, the P2 (x, x_edge) used in the first method of the above embodiment is calculated as follows. First, graphic information of a pattern to be predicted and process information such as exposure conditions and material parameters are input. An optical image intensity distribution in the resist film is obtained, and a photon absorption event is generated with a probability proportional to the optical image intensity. The image intensity distribution is approximately calculated according to the Hopkins theory in a plane direction and the Lambert Beer's law in a depth direction of the film, but a more rigorous method may be used. In EUV exposure, a plurality of secondary electrons are generated along a scattering trajectory of the photoelectrons emitted by atoms that absorbs the photons. This process is calculated by the Monte Carlo method of electron scattering. The generation of an acid of the chemical amplification resist is approximated at a secondary electron generation position, an existence probability distribution of the acid is assumed to be a Gaussian distribution centered on the acid generation position and with the acid diffusion length as a blurred amount. A polarity reversal reaction event of a plurality of polar groups contained in the resist polymer is generated with a probability proportional to the existence probability of the acid. However, an upper limit is set for the number of polarity inversions per acid and the number of polarity inversions per unit volume.

Next, the calculation space (resist film) is divided by, for example, a three-dimensional cubic lattice in an increment of 1 nm, and the matrix polymer or the molecule of the resist, which is a minimum unit of the solubility inversion, is approximated by using voxels (unit cubes formed by a lattice) formed thereby. The number of various events included in each voxel is counted, and when the number of polarity reversal reaction events per voxel exceeds a certain threshold value, it is determined that the solubility of the voxel is reversed. Further, the local solubility (per unit area) of the film is determined by counting the number of voxels whose solubility is inverted (the number of solubility reversal events of the voxels) in a depth direction at a fixed position in the plane direction and comparing the number with a certain threshold value. For example, in a case of a negative resist, when the number of solubility inversion voxels in the depth direction exceeds a first threshold value, the film is insolubilized and the residual film defect occurs locally, and when the number exceeds a second threshold value (>the first threshold value), the entire film is insolubilized.

Since the number of events included in each voxel when the resist space is exposed with a certain exposure intensity varies statistically as a result of the Monte Carlo simulation, the probability function with each number of events n as stochastic variables is obtained. When an attenuation of the light in the resist film is ignored in an optical image of a one-dimensional pattern, the exposure intensity depends only on the coordinate x, so that the probability function is a function of x. In this way, with respect to the probability function g1 with respect to the number of the solubility inversion voxels in the depth direction, a residual film defect occurrence probability in, for example, the negative resist is determined according to Equation 7.

$$P3(x) = \int g1(x, n) dn (n > nc1) \qquad \text{[Equation 7]}$$

Further, the P2 (x, x_edge) is calculated according to Equation 2. Similarly, a disappearing film defect occurrence probability in a positive resist can be obtained by the same equation. Further, the disappearing film defect occurrence probability in the negative resist or the residual film defect occurrence probability in the positive resist can be obtained by appropriately changing an integration range to n<nc2.

Further, the P2 (x, x_edge) used in the second method of the first embodiment is obtained as follows. Since generations of secondary electrons adjacent to each other on the scattering trajectory of one photoelectron are not independent (correlated), a probability of chain formation itself is evaluated. The secondary electrons generated continuously at a close distance (for example, 1 nm or less) during the scattering of the one photoelectron are defined as a secondary electron chain.

First, the Monte Carlo method is used to generate secondary electron generation events along scattering trajectories of a large number of photoelectrons, and the secondary electron chain is extracted. A point farthest from a photon absorption position with respect to the secondary electron chain is defined as an end point, and a length of the electron chain when projected from the photon absorption position toward an endpoint direction is defined as a length, and a probability density distribution P_SEstring (length, range), with the distance (range) to the end point and the length (length) as stochastic variables, is obtained. Next, using the probability density distribution P_SEstring, a probability density distribution P4 (x, x_edge, r0) that the photoelectrons generated at r0=(x0, y0) form the secondary electron chain extending from the edge at the x_edge to the x is calculated.

When the edge is at the x_edge, the probability P2 (x, x_edge) that the defect covers the region connecting the x_edge and the x is obtained by adding the probability density distribution P4 (x, x_edge, r0) for all the generated photoelectrons. That is, the probability P2 (x, x_edge) is obtained by convolving and integrating a distribution I (r0) of the number of photon absorption events and the P4 (x, x_edge, r0) as in Equation 8.

$$P2(x, x\_edge) = \text{conv}(I(r0), P4(x, x_{edge}, r0)) \qquad \text{[Equation 8]}$$

The calculation of the P2 (x, x_edge) is performed by the continuous film defect probability function calculation unit, and the g1 (x, n), P3 (x), I(x), P4 (x, x_edge, r0), P2 (x, x_edge), and the like calculated by the physicochemical simulator unit are stored in the probability function database unit. The continuous film defect probability function calculation unit also calculates the P2 (x, x_edge) by the statistical fitting described in the second embodiment.

The defect probability prediction unit receives the above P1 (x_edge) and P2 (x, x_edge) and calculates the pattern defect occurrence probability P_defect(x). In addition, a display unit for these probability functions, an external input and output unit including inputs such as the number of the defects and defect probability verification results, and the GUI for controlling these units are included. Some of the calculations performed by the physicochemical simulator may be performed by a prediction system. The g1 (x, n), P3 (x), I(x), P4 (x, x_edge, r0), P2 (x, x_edge), and the like are stored as a database inside the prediction system and used as needed.

Fourth Embodiment

Here, an embodiment relating to an operation of the system will be described. As described in the first embodiment, the disclosure relates to a method or a system that predicts the distribution of the pattern defect occurrence probabilities in each of the above regions by being applied to a plurality of predetermined partial regions on the wafer or the chip.

On the other hand, since the number of the measurement points of the pattern dimension required for predicting the defect occurrence probability of one partial region on the wafer or the chip is large, it takes a longtime to predict the defect occurrence probability for a large number of partial regions on the wafer. Therefore, a spatial distribution of a defect occurrence risk on the wafer may be predicted by another means, and the defect occurrence probability as described above may be obtained in a limited region with a high risk. As the above other means, a setting exposure and focus distribution of the exposure device or the like, a wafer shape distribution measurement result, an optical dimension measurement result, an optical defect inspection result, a past defect generation density distribution, or the like can be used.

Further, as shown in FIG. 7, a defect occurrence risk determination unit and a warning system may be added after the stochastic prediction system. When the above risk exceeds a certain threshold value, a processing of the wafer and a subsequent wafer is interrupted, a reason of an increase in the defect occurrence probability at this position is investigated, and a feedback is appropriately given to process conditions or the like.

Further, as shown in FIG. 7, for the partial region where the risk is above a certain level, it is preferable to inspect the entire pattern with the electron beam defect inspection apparatus or the like and actually measure the number of the defects and the defect density in the above partial region. Further, prediction accuracy is verified in a prediction accuracy verification unit, and when the actually measured defect density deviates from a predicted value, a feedback is given to a defect probability model. For example, a Bayesian statistical model can be applied to the feedback. By continuing the processing in a mass production process, a prediction model is made highly accurate by self-learning.

REFERENCE SIGN LIST 801 electron source
802 extraction electrode
803 electron beam
804 condenser lens
805 scanning deflector
806 objective lens
807 sample chamber
808 sample table
809 sample
810 electron
811 secondary electron
812 conversion electrode
813 detector
814 control device
815 A/D converter
816 image processing unit
817 CPU
818 image memory
819 storage medium
820 workstation

The invention claimed is:

1. A non-transitory computer-readable medium that stores a program instruction executable on a computer system to implement a computer-executed method for estimating an occurrence probability of a defect of a wafer based on measurement data obtained by a measurement tool, wherein the computer-executed method includes
acquiring or generating first data pertaining to a probability that an edge of a pattern determined based on measurement data for a plurality of measurement points on the wafer is present at a first position,
acquiring or generating second data pertaining to a probability that a defect covers a region including the first position and a second position which is different from the first position when the edge is at the first position, and
predicting the occurrence probability of the defect based on a product of the first data and the second data.

2. The non-transitory computer-readable medium according to claim 1, wherein
when an edge position coordinate relative to a design pattern of the first position is at x_edge, the first data is P1(x_edge), which is a frequency distribution of the x_edge obtained based on the measurement data of the plurality of measurement points.

3. The non-transitory computer-readable medium according to claim 1, wherein
when the edge is at x_edge, the second data is a probability function P2(x, x_edge) that the film defect continuously occurs between the x_edge and the second position x.

4. The non-transitory computer-readable medium according to claim 3, wherein
the probability function P2 is derived by obtaining a local film defect probability P3 per unit area based on a light intensity distribution obtained by an exposure device that projects a pattern on the wafer, and obtaining a direct product in a range from the x_edge to the second position x for the P3.

5. The non-transitory computer-readable medium according to claim 3, wherein the probability function P2 is derived by obtaining a probability that photoelectrons generated by photons of light projected on a resist film formed on the wafer by an exposure device that projects a pattern on the wafer generate secondary electrons in proximity between the x_edge and the second position x of the resist film.

6. The non-transitory computer-readable medium according to claim 1, wherein
based on a measurement of a plurality of patterns formed on a wafer different from a wafer for which the occurrence probability of the defect is to be estimated, the first data and the occurrence probability of the defect are derived, and the second data are derived based on first data pertaining to the different wafer and a defect occurrence distribution.

7. The non-transitory computer-readable medium according to claim 6, wherein
when an edge position coordinate relative to a design pattern of the first position is at x_edge, the first data is P1(x_edge), which is a frequency distribution of the x_edge obtained based on the measurement data of the plurality of measurement points.

8. The non-transitory computer-readable medium according to claim 7, wherein
a learning model is generated that receives the P1(x_edge) and outputs the occurrence probability of the defect and in which a parameter learned by using teaching data is provided as the second data in an intermediate layer, and the occurrence probability of the defect is output by inputting the P1(x_edge) into the learning model.

9. The non-transitory computer-readable medium according to claim 6, wherein
when the edge is at x_edge, the second data is a probability function P2(x, x_edge) that a film defect continuously occurs between the x_edge and the second position x.

10. The non-transitory computer-readable medium according to claim 6, wherein
the wafer different from the wafer for which the occurrence probability of the defect is to be estimated and the wafer for which the occurrence probability of the defect is to be estimated are wafers having different manufacturing conditions.

11. A system configured to predict an occurrence probability of a defect on a wafer, the system comprising:
a measurement tool configured to generate an output based on detection of a signal obtained by irradiating the wafer with a beam; and
a computer configured to
acquire or generate first data pertaining to a probability that an edge of a pattern determined based on measurement data for a plurality of measurement points on the wafer is present at a first position,
acquire or generate second data pertaining to a probability that a film defect covers a region between the first position and a second position which is different from the first position when the edge is at the first position, and
obtain a product of the first data and the second data.

12. The system according to claim 11, wherein
when an edge position coordinate relative to a design pattern of the first position is at x_edge, the first data is P1(x_edge), which is a frequency distribution of the x_edge obtained based on the measurement data of the plurality of measurement points.

13. The system according to claim 12, wherein
the computer generates a learning model that receives the first data and outputs the occurrence probability of the defect and in which a parameter learned by using teaching data is provided as the second data in an intermediate layer, and outputs the occurrence probability of the defect by inputting the first data into the learning model.

14. The system according to claim 11, wherein
when the edge is at x_edge, the second data is a probability function P2(x, x_edge) that a defect continuously occurs between the x_edge and the second position x.

15. The system according to claim 14, wherein
the computer derives the probability function P2 by obtaining a local film defect probability P3 per unit area based on a light intensity distribution obtained by an exposure device that projects a pattern on the wafer, and obtaining a direct product in a range from the x_edge to the second position x for the P3.

16. The system according to claim 14, wherein
the computer derives the probability function P2 by obtaining a probability that photoelectrons generated by photons of light projected on a resist film formed on the wafer by an exposure device that projects a pattern on the wafer generate secondary electrons in proximity between the x_edge and the second position x of the resist film.

17. The system according to claim 11, wherein
the computer is configured to output the second data by inputting the first data and an actually measured value of the occurrence probability of the defect.

* * * * *